United States Patent
Ishibashi

(10) Patent No.: US 10,193,198 B2
(45) Date of Patent: Jan. 29, 2019

(54) CELL MANAGEMENT DEVICE AND POWER SUPPLY DEVICE

(71) Applicant: Panasonic Intellectual Property Management Co., Ltd., Osaka (JP)

(72) Inventor: Tatsuya Ishibashi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 87 days.

(21) Appl. No.: 15/504,060

(22) PCT Filed: Feb. 24, 2016

(86) PCT No.: PCT/JP2016/000975
§ 371 (c)(1),
(2) Date: Feb. 15, 2017

(87) PCT Pub. No.: WO2016/147572
PCT Pub. Date: Sep. 22, 2016

(65) Prior Publication Data
US 2017/0279171 A1    Sep. 28, 2017

(30) Foreign Application Priority Data
Mar. 13, 2015    (JP) .................................. 2015-050825

(51) Int. Cl.
*H01M 2/00* (2006.01)
*H01M 10/633* (2014.01)
(Continued)

(52) U.S. Cl.
CPC .......... *H01M 10/633* (2015.04); *G01R 31/36* (2013.01); *H01M 10/0525* (2013.01);
(Continued)

(58) Field of Classification Search
CPC ............. H01M 8/04298; H01M 8/043; H01M 8/04302; H01M 8/04537; H01M 8/04544;
(Continued)

(56) References Cited

U.S. PATENT DOCUMENTS 7,726,975 B2 * 6/2010 Christensen ........ H01M 6/5005
429/50

FOREIGN PATENT DOCUMENTS

JP    2010-066232    3/2010
JP    2013-089363    5/2013

OTHER PUBLICATIONS

International Search Report of PCT application No. PCT/JP2016/000975 dated May 10, 2016.

* cited by examiner

*Primary Examiner* — Anthony R. Jimenez
(74) *Attorney, Agent, or Firm* — McDermott Will & Emery LLP

(57) ABSTRACT

A battery management device includes an SOC estimation unit, a storage unit, and a lithium deposition determination unit. The lithium deposition determination unit compares a differential coefficient of a battery voltage with respect to an SOC estimated by the SOC estimation unit and a differential coefficient of a battery voltage with respect to a reference SOC read from the storage unit, and determines that, if a difference is observed between the differential coefficients, lithium is deposited in a lithium ion secondary battery.

12 Claims, 11 Drawing Sheets

(51) Int. Cl.
  *G01R 31/36* (2006.01)
  *H01M 10/48* (2006.01)
  *H01M 10/635* (2014.01)
  *H01M 10/0525* (2010.01)
  *H01M 10/44* (2006.01)
  *H02J 7/00* (2006.01)
  *H01M 10/42* (2006.01)

(52) U.S. Cl.
  CPC ....... *H01M 10/425* (2013.01); *H01M 10/446* (2013.01); *H01M 10/48* (2013.01); *H01M 10/486* (2013.01); *H01M 10/635* (2015.04); *H02J 7/0047* (2013.01); *H01M 2010/4271* (2013.01); *H01M 2010/4278* (2013.01); *H02J 2007/005* (2013.01); *Y02T 10/7011* (2013.01)

(58) Field of Classification Search
  CPC ......... H01M 8/04567; H01M 8/04626; H01M 8/04858; H01M 8/04865; H01M 8/04888
  See application file for complete search history.

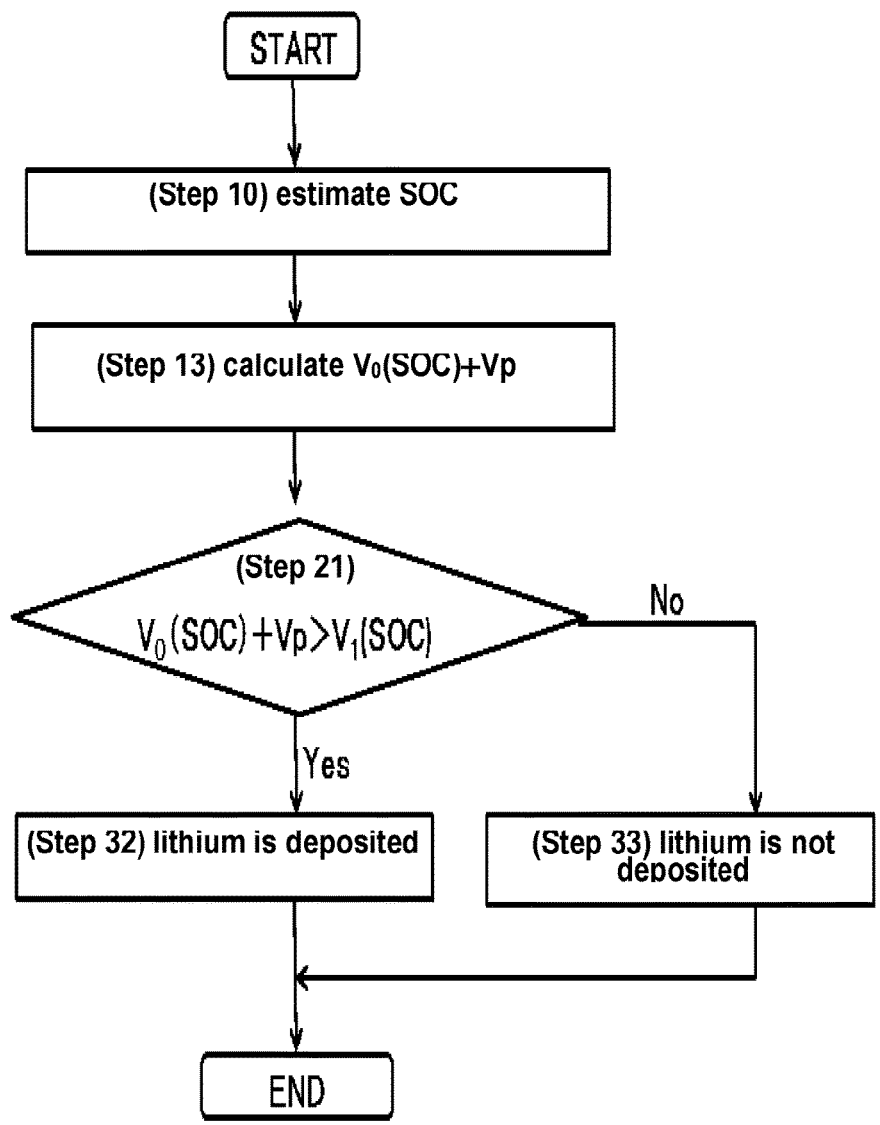

CELL MANAGEMENT DEVICE AND POWER SUPPLY DEVICE

TECHNICAL FIELD

The present disclosure relates to a battery management device and a power supply device for a lithium ion secondary battery.

BACKGROUND ART

Compared with lap-top PCs, cellular phones, and other similar devices, vehicular secondary batteries and large-scale power storage systems are required to rigorously be safely controlled. A method for estimating a deterioration state of a lithium ion secondary battery by determining whether lithium is deposited is widely known. In PTL 1, an amount of change (dV/dt) in battery voltage V that gradually rises per time t through constant current charging is detected, and a minimum value of the amount of change (dV/dt) in battery voltage V per time t is calculated to determine whether lithium is deposited.

In PTL 2, an OCV and an SOC of a lithium ion secondary battery of a vehicle that has moved a predetermined travel distance are calculated, and these values are compared with an OCV and an SOC at a time when the lithium ion secondary battery has not yet been used to determine whether lithium is deposited.

CITATION LIST

Patent Literature

PTL 1: Unexamined Japanese Patent Publication No. 2013-89363
PTL 2: Unexamined Japanese Patent Publication No. 2010-66232

SUMMARY OF THE INVENTION

In the example of PTL 1, whether lithium is deposited is determined for a lithium ion secondary battery configured by a three-pole battery including an action pole made of graphite (C), a counter pole made of lithium cobalt oxide (LiCoO2), and a reference pole made of lithium (Li). In PTL 1, whether lithium is deposited due to a temporary change in dV/dt during charging is also determined. For making a determination of whether lithium is deposited in a battery module configured by a plurality of batteries with the technique disclosed in PTL 1, finding a minimum value in dV/dt at which deposited lithium is observed might sometimes be difficult due to natures of the batteries. In addition to a battery module configured by a plurality of batteries, even in a battery module configured by only one battery, precisely knowing a temporary change in dV/dt at which deposited lithium is detected might sometimes be difficult due to natures of the batteries.

In PTL 2, an OCV and other values are calculated at a timing when a vehicle has moved a predetermined travel distance. Therefore, a determination of whether lithium is deposited can be made only after the vehicle has moved a predetermined travel distance. Thus, even if lithium is deposited during travelling, means for preventing a battery from being degraded cannot be taken.

In view of the above circumstances, the present disclosure has an object to provide a battery management device and a power supply device capable of detecting deposited lithium even during charging of a battery module configured by a lithium ion secondary battery.

A battery management device according to the present disclosure includes an SOC estimation unit, a storage unit, and a lithium deposition determination unit. The SOC estimation unit estimates a State of Charge (SOC) of a lithium ion secondary battery. The storage unit retains reference data used for determining whether lithium is deposited from the lithium ion secondary battery. The lithium deposition determination unit compares a differential coefficient of a battery voltage with respect to an SOC estimated by the SOC estimation unit, with a differential coefficient of a battery voltage with respect to a reference SOC read from the storage unit, and determines that lithium is deposited in a lithium ion secondary battery when a difference is observed between the differential coefficients.

The lithium deposition determination unit also compares measurement data created based on an SOC estimated by the SOC estimation unit and a battery voltage corresponding to the estimated SOC, with reference data created based on a reference SOC read from the storage unit and the battery voltage, and determines that lithium is deposited in the lithium ion secondary battery when a difference is observed between the measurement data and the reference data. The reference data is data set by taking into account a discharge stop voltage of the lithium ion secondary battery.

According to the present disclosure, a battery management device and a power supply device capable of detecting deposited lithium during charging of a battery module configured by a lithium ion secondary battery can be provided.

BRIEF DESCRIPTION OF DRAWINGS

FIG. 11 is a flowchart for determining whether lithium is deposited, according to the second exemplary embodiment.

DESCRIPTION OF EMBODIMENTS

Figure 1:
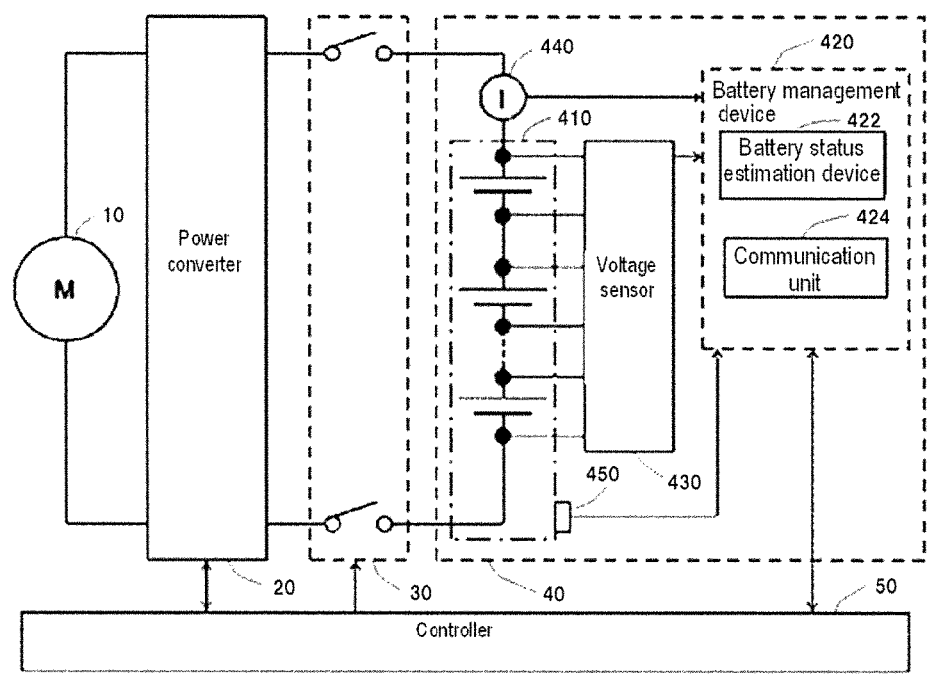
FIG. 1 is a view for describing a storage battery system according to an exemplary embodiment.

Exemplary embodiments will now be described in detail with reference to the drawings. Some descriptions might be omitted for substantially identical configurations shown in the drawings to avoid duplication.

Figure 2:
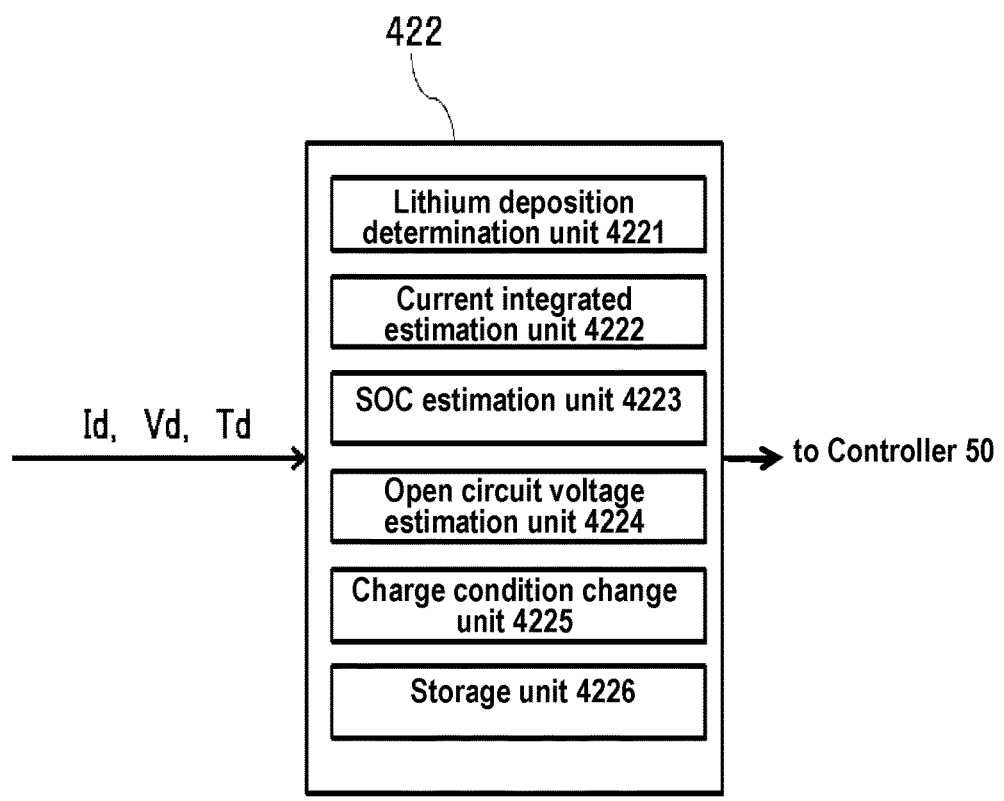
FIG. 2 is a view illustrating a configuration example of a battery status estimation device according to the exemplary embodiment.
Figure 3:
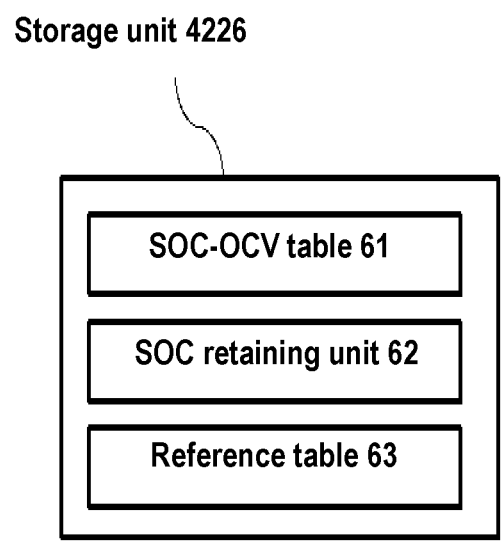
FIG. 3 is a view illustrating a configuration example of a storage unit according to the exemplary embodiment.

FIG. 1 is a view for describing power supply device 40 according to an exemplary embodiment. FIG. 2 is a view illustrating a configuration example of battery status estimation device 422 according to the exemplary embodiment. FIG. 3 is a view illustrating a configuration example of storage unit 4226 according to the exemplary embodiment. FIGS. 1 to 3 are common to a first exemplary embodiment and a second exemplary embodiment described later. This exemplary embodiment assumes that power supply device 40 is mounted in a vehicle, such as a hybrid electric vehicle (HEV), a plug-in hybrid electric vehicle (PHEV), or an electric vehicle (EV), to serve as a power supply.

Running motor 10 is, for example, a three-phase AC synchronous motor. Power converter 20 is coupled to power supply device 40 via relay 30. At a time of power running, power converter 20 converts DC power supplied from power supply device 40 into an alternating current, and supplies the alternating current to running motor 10. At a time of regeneration, power converter 20 converts AC power supplied from running motor 10 into DC power, and supplies the DC power to power supply device 40.

Relay 30 is controlled to an open status or a closed status through a relay control signal sent from controller 50. In the closed status, relay 30 couples power converter 20 and power supply device 40 to form a charging and discharging path. In the open status, relay 30 disconnects the charging and discharging path between power converter 20 and power supply device 40.

Controller 50 electrically controls an entire vehicle. Based on an operation amount of an accelerator operated by a user, a vehicle speed, information from the power supply device 40, and other information, controller 50 sets a torque request value for running motor 10. Controller 50 controls power converter 20 so that running motor 10 operates in accordance with this torque request value. For example, as a torque request value increases, controller 50 accordingly controls power converter 20 so that further electric power is supplied to running motor 10 in conformity to an increased degree of the torque request value. As the torque request value reduces, controller 50 controls power converter 20 so that electric power generated by running motor 10 from deceleration energy as an energy source is supplied to power supply device 40.

Power supply device 40 includes battery module 410, battery management device 420, voltage sensor 430, current sensor 440, and temperature sensor 450.

Battery module 410 is configured by at least one battery (also referred to as a secondary battery). This exemplary embodiment assumes that a lithium ion secondary battery is used as a battery included in battery module 410. Although, in FIG. 1, battery module 410 is configured by a plurality of batteries coupled in series, battery module 410 may be configured by a single battery. Some or all of the batteries included in battery module 410 may be coupled in parallel to each other. In this exemplary embodiment, unless otherwise specified, a battery means a single battery.

Battery module 410 is coupled to power converter 20 via relay 30. When running motor 10 operates as a power supply source (at the time of regeneration), battery module 410 can accept the supplied charging electric power via power converter 20. When running motor 10 operates as a load (at the time of power running), battery module 410 can supply the discharging electric power via power converter 20.

Through external charging and power running/regeneration control performed by power converter 20, a battery in power supply device 40 is charged and discharged. To avoid overcharging and overdischarging, controller 50 is required to precisely recognize a state of charge (SOC, also referred to as a charge rate) of the battery. That is, charging and discharging of the battery are controlled by controller 50. Voltage sensor 430 detects voltage value Vd of a terminal voltage of each of the plurality of batteries configuring battery module 410 (a potential difference between a positive electrode and a negative electrode of each of the batteries). Voltage sensor 430 outputs detected voltage value Vd of each battery to battery management device 420.

Current sensor 440 is disposed between battery module 410 and power converter 20 to measure current value Id of a current flowing into battery module 410. Current sensor 440 outputs detected current value Id to battery management device 420.

Temperature sensor 450 detects temperature Td of battery module 410 (for example, a surface temperature of battery module 410). Battery module 410 outputs detected temperature Td to battery management device 420.

Battery management device 420 includes battery status estimation device 422 and communication unit 424. Battery status estimation device 422 uses battery-status data including current value Id, voltage value Vd, and temperature Td to estimate a battery status such as an SOC.

Communication unit 424 sends information regarding the battery status such as the SOC estimated by battery status estimation device 422 to controller 50. Battery management device 420 and controller 50 are coupled via a network such as a controller area network (CAN).

Battery status estimation device 422 includes lithium deposition determination unit 4221, current integrated estimation unit 4222, open circuit voltage estimation unit 4224, SOC estimation unit 4223, charge condition change unit 4225, and storage unit 4226. Storage unit 4226 includes SOC-OCV table 61, SOC retaining unit 62, and reference table 63. Charge condition change unit 4225 included in battery status estimation device 422 in this exemplary embodiment may separately be provided in battery management device 420.

An estimation of an SOC of a battery according to this exemplary embodiment will now first be described herein.

Current integrated estimation unit 4222 performs an integration with current value Id flowing into a battery, which is detected by current sensor 440, to estimate SOC_i of the battery. Specifically, (Equation 1) shown below is used to estimate an SOC.

$$SOC\_i = SOC0 \pm (Q/FCC) \times 100 \quad \text{(Equation 1)}$$

SOC0 represents an SOC before charging and discharging start, Q represents a current integration value (Unit: Ah), and FCC represents a full charge capacity. A symbol "+" represents charging, while a symbol "−" represents discharging. To calculate SOC_i, an FCC to which a temperature correction, a current correction, and other corrections are implemented may be used.

Open circuit voltage estimation unit 4224 estimate an open circuit voltage (OCV) of each of the secondary batteries from current value Id received from current sensor 440, voltage value Vd received from voltage sensor 430 for each secondary battery, and internal resistance R of each secondary battery to identify SOC_v corresponding to the OCV.

$$OCV = Vd \pm Id \times R \quad \text{(Equation 2)}$$

(Equation 2) is merely an example OCV estimation equation, and thus another estimation equation may be used. For example, an estimation equation into which a temperature correction is introduced may be used.

Open circuit voltage estimation unit 4224 refers to SOC-OCV table 61 to identify SOC_v corresponding to the calculated OCV to read the identified SOC_v.

SOC-OCV table 61 is a table describing a relationship between SOC of a battery and open circuit voltage (OCV) of the battery. SOC-OCV table 61 is generated, through a preliminarily experiment or simulation, from data on SOCs and OCVs obtained when, for example, a battery in a status where a charge rate is 0% is gradually charged.

SOC estimation unit 4223 uses the calculated SOC_i and SOC_v to determine an SOC that should be adopted. For example, SOC estimation unit 4223 can use SOC_v as it is while a secondary battery is neither charged nor discharged, whereas SOC estimation unit 4223 can use SOC_i as it is or SOC_i corrected with SOC_v while the secondary battery is charged and discharged. An SOC estimated by SOC estimation unit 4223 and a corresponding voltage are retained in SOC retaining unit 62.

Figure 4:
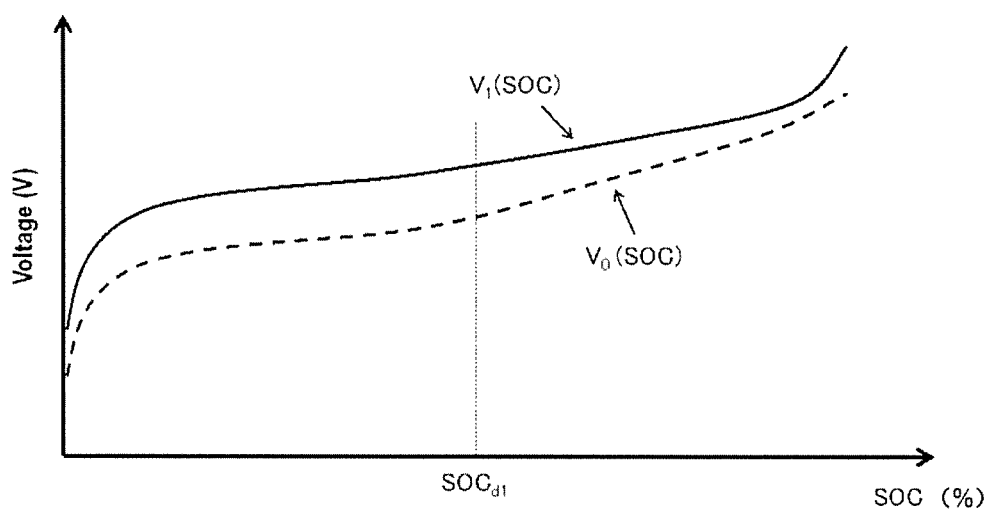
FIG. 4 is a conceptual graph illustrating a relationship between SOC and voltage of a lithium ion secondary battery according to the exemplary embodiment.

FIG. 4 is a conceptual graph illustrating a relationship between SOC and voltage of a lithium ion secondary battery. FIG. 4 is common to a first exemplary embodiment and a second exemplary embodiment described later. In FIG. 4, a horizontal axis shows an SOC, and a vertical axis shows a voltage.

In FIG. 4, $V_1(SOC)$ is plotted with SOCs and corresponding voltages retained in SOC retaining unit 62. $V_1(SOC)$ represents a correspondence relationship between SOC and voltage when a lithium ion secondary battery is charged to an extent that deposited lithium is observed. In $V_1(SOC)$, deposited lithium can be observed when SOC≥SOCd1 is satisfied. A lithium ion secondary battery observed with deposited lithium can be determined that the lithium ion secondary battery is in a deterioration status.

In FIG. 4, $V_0(SOC)$ is a graph when a lithium ion secondary battery is charged to an extent that no deposited lithium is observed. In contrast to $V_1(SOC)$, $V_0(SOC)$ is a graph served as a reference for determining whether lithium is deposited.

As a method for obtaining data with respect to $V_0(SOC)$, for example, data can be obtained by charging at a lower rate (for example, 0.2 C) a lithium ion secondary battery in an initial status, and measuring a battery voltage with respect to an SOC. An initial status is referred to as, for example, a status immediately after a lithium ion secondary battery is produced. A lower rate means a charge rate at which lithium is prevented from being deposited even if a lithium ion secondary battery in a deterioration status is charged. Data with respect to $V_0(SOC)$ obtained with this method can be stored in reference table 63.

In another available method for obtaining data with respect to $V_0(SOC)$, an SOC-OCV table and a DCIR map are used for calculation. An SOC-OCV table is a table describing a relationship between SOC of a battery and open circuit voltage (OCV) of the battery. A direct current internal resistance (DCIR) is referred to as a DC resistance component of an electric resistance when a lithium ion secondary battery is seen in macro perspective, and includes a charge transfer resistance equivalently acting as an electric resistance when lithium ions Li+ enter into and exit from an electrode surface, and a pure electrical resistance against movements of electrons e⁻ at negative and positive electrodes. In this exemplary embodiment, unless otherwise specifically described, a DCIR means an internal resistance.

A method for the latter case may preferably be used when obtaining data with respect to $V_0(SOC)$ from a battery where an internal resistance of a lithium ion secondary battery in an initial status changes due to an SOC. A method for the former case may be used when obtaining data with respect to $V_0(SOC)$ from a battery where an internal resistance of a lithium ion secondary battery in an initial status does not change due to an SOC.

Figure 5:
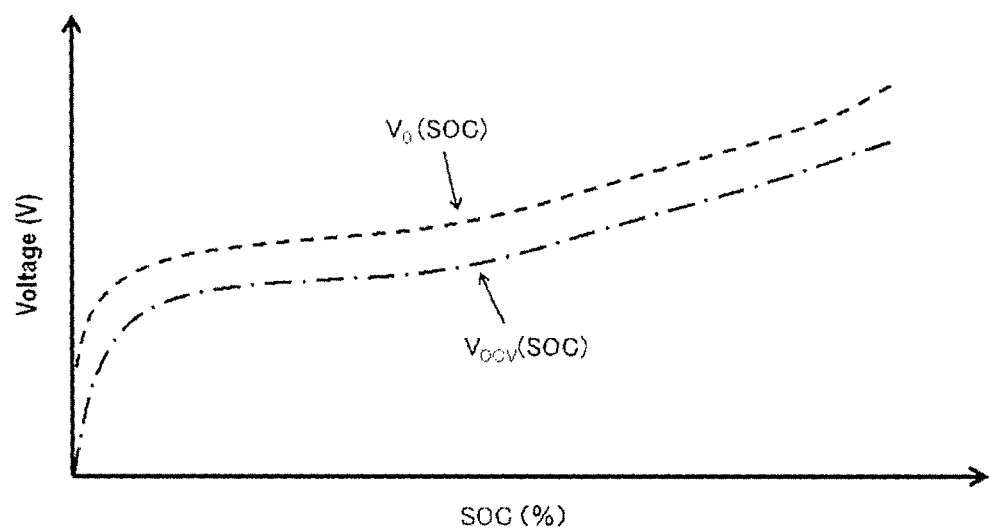
FIG. 5 is a conceptual graph illustrating a relationship between reference SOC and voltage according to the exemplary embodiment, where an SOC-OCV table is also shown.
Figure 6:
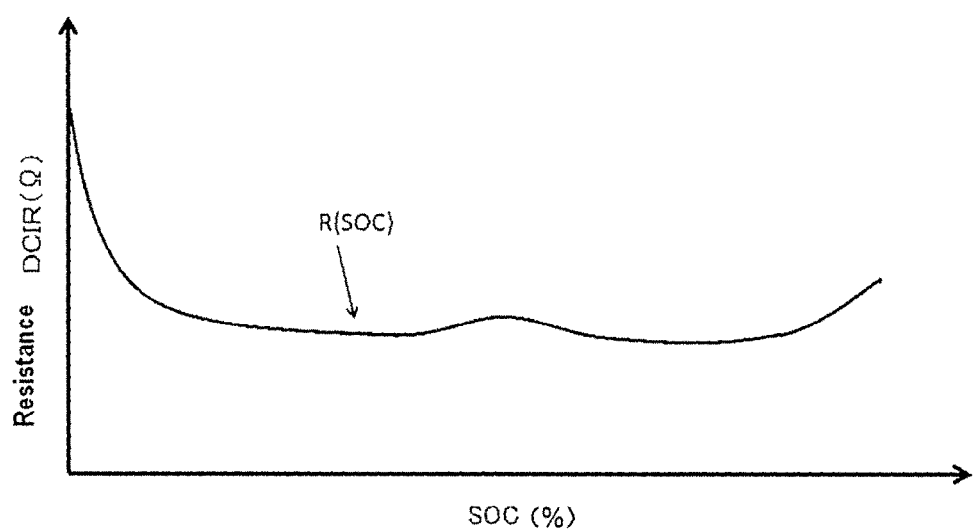
FIG. 6 is a conceptual graph of a DCIR map with respect to SOC, according to the exemplary embodiment.

The method for the latter case for obtaining data with respect to $V_0(SOC)$ will now additionally be described herein. FIG. 5 is a conceptual graph illustrating a relationship between reference SOC and voltage, where an SOC-OCV table is also shown. FIG. 6 is a conceptual graph of a DCIR map with respect to SOC. The SOC-OCV table is data identical to data of SOC-OCV table 61. The DCIR map can be stored in reference table 63. Data with respect to the DCIR map can be obtained through a preliminarily experiment and/or simulation.

$V_{OCV}(SOC)$ shown in FIG. 5 can be regarded as an SOC-OCV table. $V_0(SOC)$ shown in FIG. 6 conforms to $V_0(SOC)$ shown in FIG. 4. $V_0(SOC)$ can be obtained using (Equation 3) shown below.

$$V_0(SOC)=V_{OCV}(SOC)+I\times R(SOC) \quad \text{(Equation 3)}$$

A symbol "I" represents charge current Id at a timing of determining whether lithium is deposited. For resistance R(SOC), a DCIR corresponding to an SOC shown in FIG. 6 is used as R(SOC).

Lithium deposition determination unit 4221 can be used, for example, to perform a process with respect to this method. Lithium deposition determination unit 4221 refers to SOC-OCV table 61 and reference table 63 to read $V_{OCV}(SOC)$+ and R(SOC) to calculate $V_0(SOC)$ using (Equation 3).

Next, a method for determining whether lithium is deposited according to the first exemplary embodiment will now be described herein.

Figure 7:
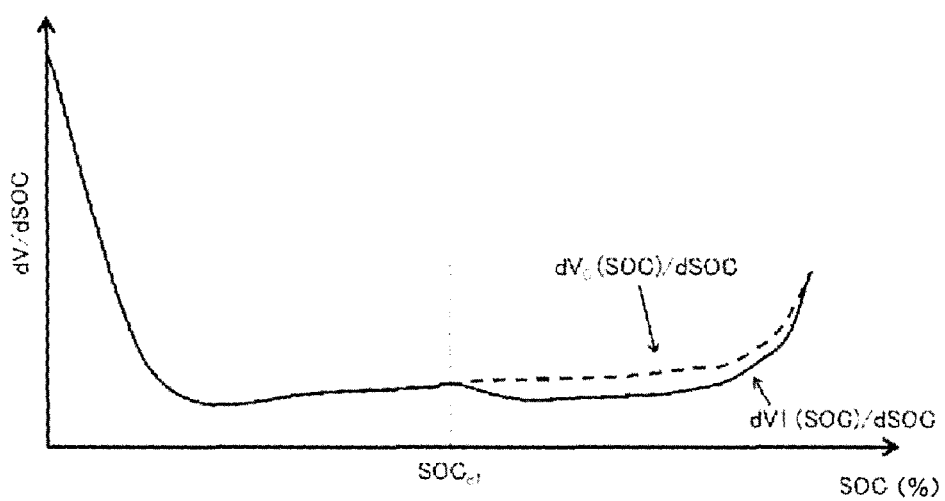
FIG. 7 is a conceptual graph illustrating a relationship between SOC and voltage of a lithium ion secondary battery according to a first exemplary embodiment.

FIG. 7 is a conceptual graph illustrating a relationship between SOC and voltage of a lithium ion secondary battery according to the first exemplary embodiment. In FIG. 7, a horizontal axis shows SOC, and a vertical axis shows differential coefficient of voltage with respect to the SOC. That is, the vertical axis of FIG. 7 shows the differential coefficient with respect to the graph in FIG. 4. In FIG. 7, $dV_0(SOC)/dSOC$ represents an SOC of $V_0(SOC)$ and a differential coefficient shown in FIG. 4, and is referred to as reference data. In FIG. 7, $dV_1(SOC)/dSOC$ represents an SOC of $V_1(SOC)$ and a differential coefficient shown in FIG. 4, and is referred to as measurement data.

According to FIG. 7, when charging a lithium ion secondary battery with respect to $dV_1(SOC)/dSOC$ in a region satisfying SOC<SOCd1, differential coefficients of $dV_0(SOC)/dSOC$ and $dV_1(SOC)/dSOC$ match. When charging a lithium ion secondary battery with respect to $dV_1(SOC)/dSOC$ in a region satisfying SOC≥SOCd1, a difference arises between the differential coefficients of $dV_0(SOC)/dSOC$ and $dV_1(SOC)/dSOC$. That is, in the region satisfying SOC≥SOCd1, $dV_0(SOC)/dSOC>dV_1(SOC)/dSOC$ is satisfied. When charging the lithium ion secondary battery with respect to $dV_1(SOC)/dSOC$ in the region satisfying SOC≥SOCd1, the lithium ion secondary battery with respect to $dV_1(SOC)/dSOC$ can be determined that lithium is deposited on a negative electrode.

The reason why a difference arises between the differential coefficients of $dV_0(SOC)/dSOC$ and $dV_1(SOC)/dSOC$ due to lithium deposited from a lithium ion secondary battery is a rise in internal resistance in the lithium ion secondary battery due to the deposited lithium.

Lithium deposition determination unit 4221 can be used to determine whether lithium is deposited. Specifically, lithium deposition determination unit 4221 calculates $dV_1(SOC)/dSOC$ from a voltage corresponding to an SOC retained in SOC retaining unit 62. Lithium deposition determination unit 4221 calculates data with respect to $dV_0(SOC)/dSO$ from data with respect to $V_0(SOC)$ to C. Lithium deposition determination unit 4221 then compares $dV_1(SOC)/dSOC$ and $dV_0(SOC)/dSOC$ to determine that, if a difference is observed between these differential coefficients, lithium is deposited.

A determination of whether a difference is observed between the differential coefficients of $dV_0(SOC)/dSOC$ and $dV_1(SOC)/dSOC$ leads to a determination that lithium is deposited when a difference is observed in a predetermined charge period. This can prevent an erroneous determination when a difference between differential coefficients of $dV_0(SOC)/dSOC$ and $dV_1(SOC)/dSOC$ locally arises in a situation where, for example, SOC values temporarily fluctuate along with a fluctuation in power consumption in a load to which power supply device 40 is coupled. An extended predetermined charge period may not be required. For example, a charge period during which an SOC increases by approximately 3% may be set as a predetermined charge period.

A few errors should be allowed in a determination of whether a difference between differential coefficients of $dV_0(SOC)/dSOC$ and $dV_1(SOC)/dSOC$ arises, in other words, a determination of whether the differential coefficients of $dV_0(SOC)/dSOC$ and $dV_1(SOC)/dSOC$ match or not. That is, since batteries configuring a battery module are designed within a tolerance range, a determination of whether differential coefficients of $dV_0(SOC)/dSOC$ and $dV_1(SOC)/dSOC$ match or not can allow errors at least in a range where the tolerance is taken into account.

Although, in the first exemplary embodiment, whether lithium is deposited is substantially determined with a difference between $dV_0(SOC)/dSOC$ and $dV_1(SOC)/dSOC$ shown in FIG. 7, whether lithium is deposited can be determined without obtaining differential coefficients. Differently from the first exemplary embodiment, in a second exemplary embodiment, a method for determining whether lithium is deposited without obtaining differential coefficients is described.

Figure 8:
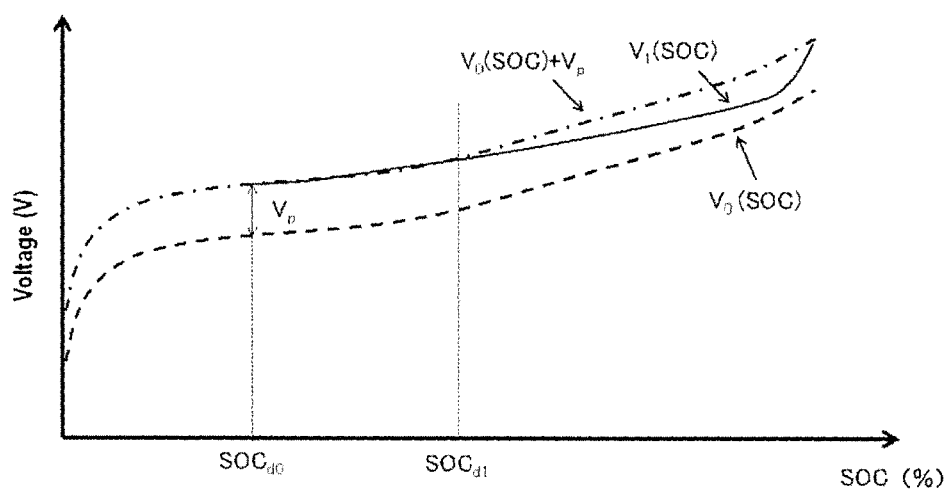
FIG. 8 is a conceptual graph illustrating a relationship between SOC and voltage according to a second exemplary embodiment.

FIG. 8 is a conceptual graph illustrating a relationship between SOC and voltage, according to the second exemplary embodiment. In the second exemplary embodiment, $V_0(SOC)+Vp$ and $V_1(SOC)$ are compared to determine whether any difference arises to determine whether lithium is deposited. Vp in $V_0(SOC)+Vp$ represents a battery voltage in $SOC=SOCd_0$ set as a lower discharge limit value. In a normal use aspect, a lithium ion secondary battery does not discharge electricity until SOC=0% is satisfied. Due to some reasons such as preventing overdischarging, $SOC=SOCd_0$ is set as a lower discharge limit value. Vp represents an actually measured value measured by voltage sensor 430.

Lithium deposition determination unit 4221 adds Vp to $V_0(SOC)$ to calculate $V_0(SOC)+Vp$. $V_0(SOC)+Vp$ is regarded as reference data in the second exemplary embodiment. And then, $V_0(SOC)+Vp$ and $V_1(SOC)$ are compared to determine whether lithium is deposited based on a result of the comparison. $V_1(SOC)$ is regarded as measurement data in the second exemplary embodiment.

In FIG. 8, when charging a lithium ion secondary battery in a region satisfying SOC<SOCd1, $V_0(SOC)+Vp$ and $V_0(SOC)$ match. In FIG. 8, when charging a lithium ion secondary battery in a region satisfying SOC≥SOCd1, a difference arises between $V_0(SOC)+Vp$ and $V_1(SOC)$. Therefore, when charging a lithium ion secondary battery with respect to $V_1(SOC)$ in a region satisfying SOC≥SOCd1, the lithium ion secondary battery with respect to $V_1(SOC)$ can be determined that lithium is deposited on a negative electrode.

Also in the second exemplary embodiment, a determination of whether a difference is observed between $V_0(SOC)+Vp$ and $V_1(SOC)$ leads to a determination that lithium is deposited when a difference is observed in a predetermined charge period. A few errors in a range where a tolerance in a battery is taken into account should be allowed in a determination of whether a difference between $V_0(SOC)+Vp$ and $V_1(SOC)$ arises, in other words, a determination of whether $V_0(SOC)+Vp$ and $V_1(SOC)$ match or not.

Next, changing a charge condition for a lithium ion secondary battery after deposited lithium is detected through the first exemplary embodiment or the second exemplary embodiment will now be described herein. Even if deposited lithium is detected, a lithium ion secondary battery can be prevented from being degraded by allowing charge condition change unit 4225 to stop charging or to change a charge condition so as to switch a charge rate to a lower charge rate to continue charging.

Stopping charging means that an upper charge limit is reset to SOC=SOCd1 as an upper charge limit value to change a charging and discharging setting so that charging and discharging are performed in a range of $SOCd_0 \leq SOC < SOCd1$.

Figure 9:
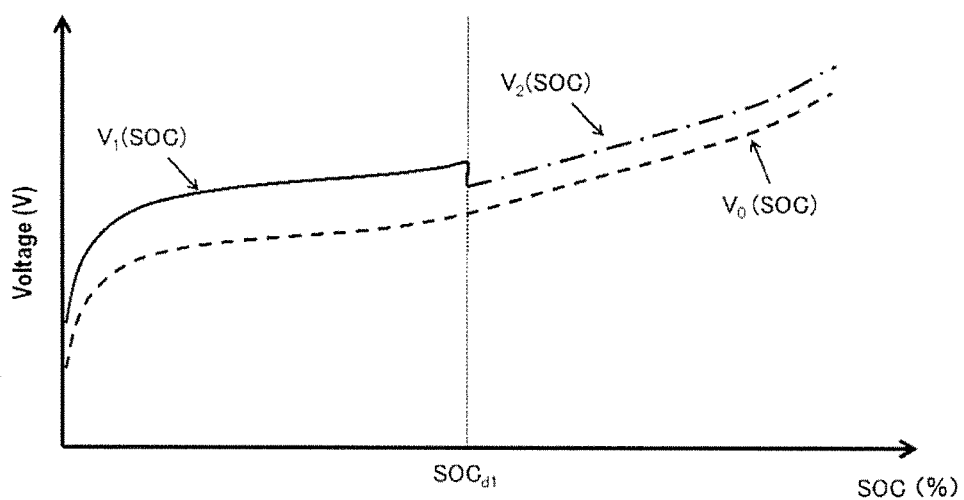
FIG. 9 is a conceptual graph of SOC and voltage, according to the exemplary embodiment, where, after deposited lithium is detected, a charge rate is switched to a lower charge rate to continue charging.

The conceptual graph for SOC and voltage shown in FIG. 9 illustrates a case when a charge rate is switched to a lower charge rate to continue charging. A charging method according to FIG. 9 is applicable to a case when deposited lithium is detected through the first exemplary embodiment or the second exemplary embodiment. In FIG. 9, $V_1(SOC)$ shown with a solid line conforms to $V_1(SOC)$ shown in FIGS. 4 and 8. In FIG. 9, $V_0(SOC)$ shown with a broken line conforms to $V_0(SOC)$ shown in FIGS. 4 and 8. In FIG. 9, $V_2(SOC)$ shown with a dashed line shows a case where a lithium ion secondary battery is charged from SOCd1 at a lower charge rate than a charge rate for $V_1(SOC)$. A differential coefficient calculated for a voltage corresponding to an SOC with respect to $V_2(SOC)$ and a differential coefficient with respect to $V_0(SOC)$ are found identical as a result of comparison. That is, charging a lithium ion secondary battery at a lower charge rate than a charge rate conforming to $V_1(SOC)$ can prevent lithium from being deposited. In charging after deposited lithium is detected, performing charging at a charge rate corresponding to $V_1(SOC)$ in an SOC region satisfying SOC<SOCd1, and performing charging at a charge rate corresponding to $V_2(SOC)$ in an SOC region satisfying SOCd1≤SOC can prevent a lithium ion secondary battery from being degraded, while a charge time can be prevented from being extended.

Figure 10:
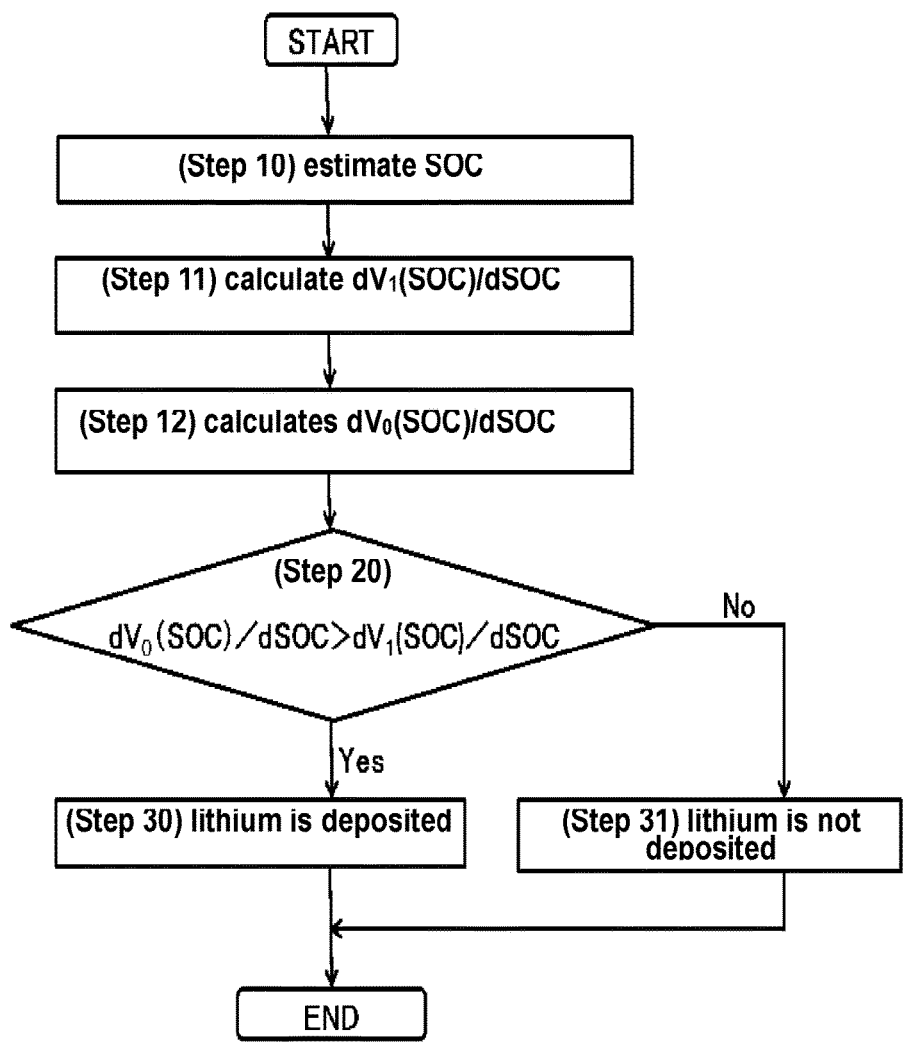
FIG. 10 is a flowchart for determining whether lithium is deposited, according to the first exemplary embodiment.

Next, a deposited lithium determination process performed by battery status estimation device 422 configured as described above will now be described herein with reference to the flowcharts shown in FIGS. 10 and 11. FIG. 10 is a flowchart for determining whether lithium is deposited through the method according to the first exemplary embodiment. FIG. 11 is a flowchart for determining whether lithium is deposited through the method according to the second exemplary embodiment.

A determination of whether lithium is deposited will now first be described herein with reference to the flowchart shown in FIG. 10.

In step 10, SOC estimation unit 4223 estimates an SOC. The estimated SOC is retained in SOC retaining unit 62 together with corresponding voltage $V_1(SOC)$.

In step 11, lithium deposition determination unit 4221 calculates $dV_1(SOC)/dSOC$ from estimated $V_1(SOC)$. In step 12, lithium deposition determination unit 4221 reads $V_0(SOC)$ from reference table 63 to calculate data with respect to $dV_0(SOC)/dSOC$. An order of steps 11 and 12 may be switched.

In step 20, lithium deposition determination unit 4221 compares $dV_0(SOC)/dSOC$ and $dV_1(SOC)/dSOC$. When $dV_0(SOC)/dSOC > dV_1(SOC)/dSOC$ is satisfied, it is determined that lithium is deposited (step 30). When $dV_0(SOC)/dSOC \leq dV_1(SOC)/dSOC$ is satisfied, it is determined that lithium is not deposited (step 31).

Next, a determination of whether lithium is deposited will now be described herein with reference to the flowchart shown in FIG. 11.

In step 10, SOC estimation unit 4223 estimates an SOC. The estimated SOC is retained in SOC retaining unit 62 together with corresponding voltage $V_1(SOC)$. In step 13, lithium deposition determination unit 4221 calculates $V_0(SOC)+Vp$. An order of steps 10 and 13 may be switched.

In step 21, lithium deposition determination unit 4221 compares $V_0(SOC)+Vp$ and $V_1(SOC)$. When $V_0(SOC)+Vp > V_1(SOC)$ is satisfied, it is determined that lithium is deposited (step 32). When $V_0(SOC)+Vp \leq V_1(SOC)$ is satisfied, it is determined that lithium is not deposited (step 33).

In the above exemplary embodiment, a battery management device for a battery used as a power supply for driving a motor in an electric vehicle or the like has been exemplified. However, a deposited lithium determination process according to the present disclosure can be performed for a battery management device for a battery used as a home or industrial power supply.

A battery management device and a power supply device according to the present disclosure are useful for power supplies for driving motors in electric vehicles and other vehicles, and for back-up power supplies.

The invention claimed is:

1. A battery management device comprising:
an SOC estimation unit for estimating a State of Charge (SOC) of a lithium ion secondary battery;
a storage unit for retaining reference data for determining whether lithium is deposited in the lithium ion secondary battery; and
a lithium deposition determination unit for comparing a differential coefficient of a battery voltage with respect to an estimated SOC by the SOC estimation unit, with a differential coefficient of a battery voltage with respect to a reference SOC read from the storage unit, and for determining that lithium is deposited in the lithium ion secondary battery when a difference is observed between the differential coefficients.

2. The battery management device according to claim 1, wherein the reference SOC and the battery voltage corresponding to the reference SOC are measured by charging at a lower rate the lithium ion secondary battery during an initial status.

3. The battery management device according to claim 1, wherein the reference SOC and the battery voltage corresponding to the reference SOC are obtained from an SOC-Open Circuit Voltage (OCV) table and a Direct Current Internal Resistance (DCIR) map.

4. The battery management device according to claim 1, further comprising a charge condition change unit,
wherein the charge condition change unit sets a voltage at which deposited lithium is detected by the lithium deposition determination unit as an upper limit voltage for charging the lithium ion secondary battery.

5. The battery management device according to claim 1, further comprising a charge condition change unit,
wherein the charge condition change unit switches, when deposited lithium is detected by the lithium deposition determination unit, a charge rate for the lithium ion secondary battery to a charge rate lower than a charge rate at which the deposited lithium is detected.

6. A battery management device comprising:
an SOC estimation unit for estimating a State of Charge (SOC) of a lithium ion secondary battery;
a storage unit for retaining reference data for determining whether lithium is deposited in the lithium ion secondary battery; and
a lithium deposition determination unit for comparing measurement data created based on an estimated SOC by the SOC estimation unit and a battery voltage corresponding to the estimated SOC, with reference data created based on a reference SOC read from the storage unit and a battery voltage, and for determining that lithium is deposited in the lithium ion secondary battery when a difference is observed between the measurement data and the reference data,
wherein the reference data is data set based on a discharge stop voltage of the lithium ion secondary battery.

7. The battery management device according to claim 6, wherein the reference SOC and the battery voltage corresponding to the reference SOC are measured by charging at a lower rate the lithium ion secondary battery an initial status.

8. The battery management device according to claim 6, wherein the reference SOC and the battery voltage corresponding to the reference SOC are obtained from an SOC-Open Circuit Voltage (OCV) table and a Direct Current Internal Resistance (DCIR) map.

9. The battery management device according to claim 6, further comprising a charge condition change unit,
wherein the charge condition change unit sets a voltage at which deposited lithium is detected by the lithium deposition determination unit as an upper limit voltage for charging the lithium ion secondary battery.

10. The battery management device according to claim 6, further comprising a charge condition change unit,
wherein the charge condition change unit switches, when deposited lithium is detected by the lithium deposition determination unit, a charge rate for the lithium ion secondary battery to a charge rate lower than a charge rate at which the deposited lithium is detected.

11. A power supply device comprising:
a battery module including a plurality of lithium ion secondary batteries;
a voltage sensor for measuring a voltage of the battery module; and
a battery management device comprising:
an SOC estimation unit for estimating a State of Charge (SOC) of at least one of the plurality of lithium ion secondary batteries;
a storage unit for retaining reference data for determining whether lithium is deposited in the at least one of the plurality of lithium ion secondary batteries; and
a lithium deposition determination unit for comparing a differential coefficient of a battery voltage with respect to an estimated SOC by the SOC estimation unit, with a differential coefficient of a battery voltage with respect to a reference SOC read from the storage unit, and for determining that lithium is deposited in the at least one of the plurality of lithium ion secondary batteries when a difference is observed between the differential coefficients.

12. A power supply device comprising:
a battery module including a plurality of lithium ion secondary batteries;
a voltage sensor for measuring a voltage of the battery module; and
a battery management device comprising:
an SOC estimation unit for estimating a State of Charge (SOC) of at least one of the plurality of lithium ion secondary batteries;
a storage unit for retaining reference data for determining whether lithium is deposited in the at least one of the plurality of lithium ion secondary batteries; and
a lithium deposition determination unit for comparing measurement data created based on an estimated SOC by the SOC estimation unit and a battery voltage corresponding to the estimated SOC, with reference data created based on a reference SOC read from the storage unit and a battery voltage, and for determining that lithium is deposited in the at least one of the plurality of lithium ion secondary batteries when a difference is observed between the measurement data and the reference data,
wherein the reference data is data set based on a discharge stop voltage of the at least one of the plurality of lithium ion secondary batteries.

* * * * *